(12) United States Patent
Park et al.

(10) Patent No.: US 8,036,051 B2
(45) Date of Patent: Oct. 11, 2011

(54) SEMICONDUCTOR MEMORY DEVICE AND SEMICONDUCTOR MEMORY SYSTEM FOR COMPENSATING CROSSTALK

(75) Inventors: Sung-Joo Park, Gyeonggi-do (KR); Jae-Jun Lee, Gyeonggi-do (KR)

(73) Assignee: Samsung Electronics Co., Ltd., Maetan-dong, Yeongtong-gu, Suwon-si, Gyeonggi-do (KR)

( * ) Notice: Subject to any disclaimer, the term of this patent is extended or adjusted under 35 U.S.C. 154(b) by 329 days.

(21) Appl. No.: 12/355,421

(22) Filed: Jan. 16, 2009

(65) Prior Publication Data
US 2009/0190421 A1    Jul. 30, 2009

(30) Foreign Application Priority Data
Jan. 18, 2008  (KR) .................. 10-2008-0005789

(51) Int. Cl.
*G11C 7/00* (2006.01)
(52) U.S. Cl. .................... 365/198; 365/191; 365/201
(58) Field of Classification Search .................. 365/198; 379/416, 417
See application file for complete search history.

(56) References Cited

U.S. PATENT DOCUMENTS

| 4,890,022 | A | 12/1989 | Endo |
| 7,170,312 | B2 | 1/2007 | Kawasumi |
| 7,864,605 | B2 * | 1/2011 | Lee et al. ................ 365/198 |
| 2002/0003444 | A1 | 1/2002 | Sasaki |
| 2007/0047733 | A1 * | 3/2007 | Bremer et al. ............. 379/416 |

FOREIGN PATENT DOCUMENTS

JP          11-225172          8/1999

OTHER PUBLICATIONS

English language abstract of Japanese Publication No. 11-225172.

* cited by examiner

*Primary Examiner* — Tan T. Nguyen
(74) *Attorney, Agent, or Firm* — Muir Patent Consulting, PLLC

(57) ABSTRACT

A semiconductor memory device and a semiconductor memory system. The semiconductor memory device includes channels configured to transmit signals from a transmitter to a receiver, and a crosstalk compensator. The crosstalk compensator may be connected between the channels to compensate for crosstalk. The crosstalk compensator may comprise a capacitor connected in parallel between the channels, and a switching unit connected between the capacitor and one of the channels. The switching unit may control connections or disconnections between the capacitor and the channel. Therefore, the semiconductor memory device and the semiconductor memory system compensate for crosstalk occurring between transmitted signals that are out of phase with each other.

22 Claims, 10 Drawing Sheets

SEMICONDUCTOR MEMORY DEVICE AND SEMICONDUCTOR MEMORY SYSTEM FOR COMPENSATING CROSSTALK

CROSS-REFERENCE TO RELATED PATENT APPLICATION

This application claims the benefit of Korean Patent Application No. 10-2008-0005789, filed on Jan. 18, 2008, in the Korean Intellectual Property Office, the disclosure of which is incorporated herein in its entirety by reference.

BACKGROUND

1. Field of the Invention

Embodiments of the present invention relate to a semiconductor memory device, and more particularly, to a semiconductor memory device and a semiconductor memory system for compensating crosstalk.

2. Description of the Related Art

When a signal is transmitted through a channel, crosstalk occurs due to a signal transmitted through a neighboring channel. Crosstalk refers to a phenomenon in which electrical coupling between signals transmitted through different channels, e.g., capacitive coupling, electronic coupling, or the like, affects other channels. The crosstalk contributes to limiting a maximum operating frequency of a channel and a system. A voltage difference and a timing difference occur between transmitted signals due to the crosstalk. The timing difference varies depending on whether a transmitted signal is in phase or out of phase with a signal transmitted through a neighboring channel.

FIG. 1 is a block diagram of a conventional semiconductor memory device transmitting signals through channels.

FIG. 2A illustrates waveforms of a transmitted signal and neighboring signals that are in phase with one another, and FIG. 2B illustrates waveforms of a transmitted signal and neighboring signals that are out of phase with one another.

Referring to FIGS. 1 and 2A, if transmitted signals T1, T2, and T3 are in phase with one another, signals R1, R2, and R3 are received as shown in FIG. 2A. In other words, when the transmitted signals T1, T2, and T3 are in phase with one another, inductance among neighboring channels increases. Thus, the signal R2 is transmitted later than the signals R1 and R3 that are adjacent to the signal R1.

Referring to FIG. 1 and 2B, if the transmitted signals T1, T2, and T3 are out of phase with one another, i.e., the transmitted signals T1 and T3 are out of phase with the transmitted signal T2, signals R1, R2, and R3 are received as shown in FIG. 2B. In other words, when the transmitted signals T1, T2, and T3 are out of phase with one another, inductance among neighboring channels decreases. Thus, the signal R2 is transmitted faster than the signals R1 and R3 that are adjacent to the signal R2.

SUMMARY

Some embodiments of the present invention provide a semiconductor memory device for compensating crosstalk.

Some embodiments of the present invention also provide a semiconductor memory system for compensating crosstalk.

According to an aspect of the present invention, there is provided a semiconductor memory device including: a plurality of channels configured to transmit signals from a transmitter to a receiver; and a crosstalk compensator connected between the channels to compensate for crosstalk, wherein the crosstalk compensator comprises: at least one capacitor connected in parallel between the channels; and at least one switching unit connected between the at least one capacitor and one of the channels, the at least one switching unit being configured to control connections or disconnections between the at least one capacitor and the channel.

The crosstalk compensator may be connected between the channels in substantially a center region between the transmitter and the receiver, may be connected between the channels and adjacent to the transmitter, or may be connected between the channels and adjacent to the receiver.

According to another aspect of the present invention, there is provided a semiconductor memory system including: a plurality of channels configured to transmit signals from a first memory chip to a second memory chip; and a crosstalk compensator connected between the channels to compensate for crosstalk, wherein the crosstalk compensator comprises: at least one capacitor connected in parallel between the channels; and at least one switching unit connected between the capacitors and one of the channels, and the at least one switching unit is configured to control connections or disconnections between the at least one capacitor and the channels.

The semiconductor memory system may further include a controller that is configured to control the switches to determine capacitance of the crosstalk compensator.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE EMBODIMENTS

Figure 1:
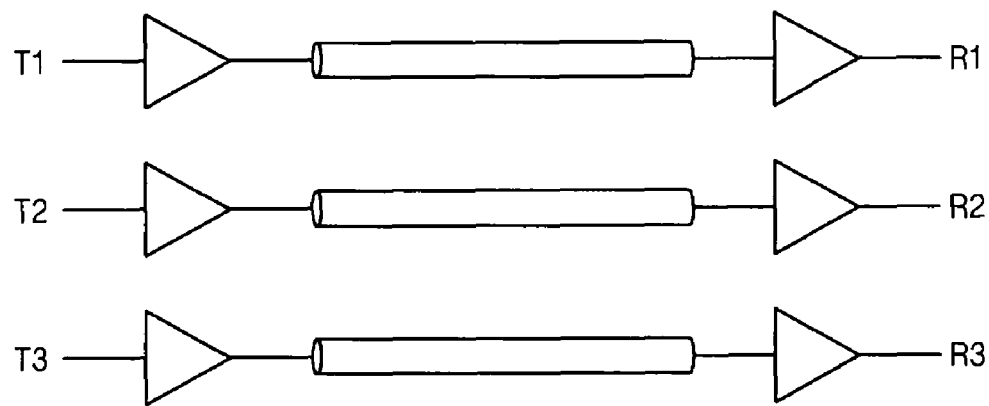
FIG. 1 is a block diagram of a conventional semiconductor memory device transmitting signals through channels.
Figure 2A:
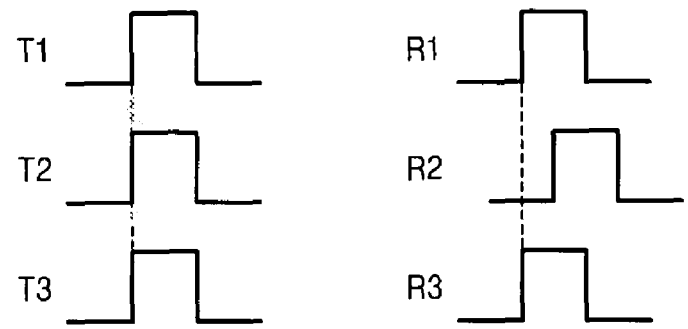
FIG. 2A illustrates waveforms of a transmitted signal and neighboring signals that are in phase with one another.
Figure 2B:
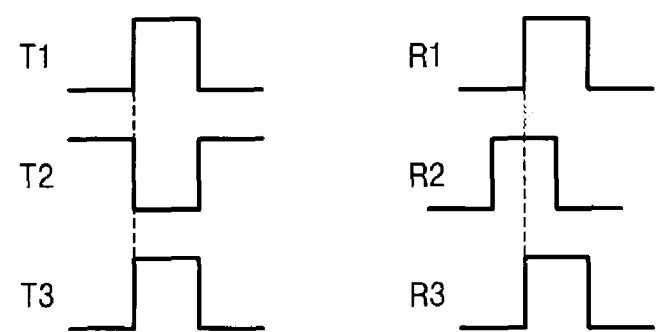
FIG. 2B illustrates waveforms of a transmitted signal and neighboring signals that are out of phase with one another.

The attached drawings for illustrating preferred embodiments of the present invention are referred to in order to gain a sufficient understanding of the present invention, the merits thereof, and the objectives accomplished by the implementation of the present invention.

Hereinafter, the present invention will be described in detail by explaining preferred embodiments of the invention with reference to the attached drawings. Like reference numerals in the drawings denote like elements.

Figure 3:
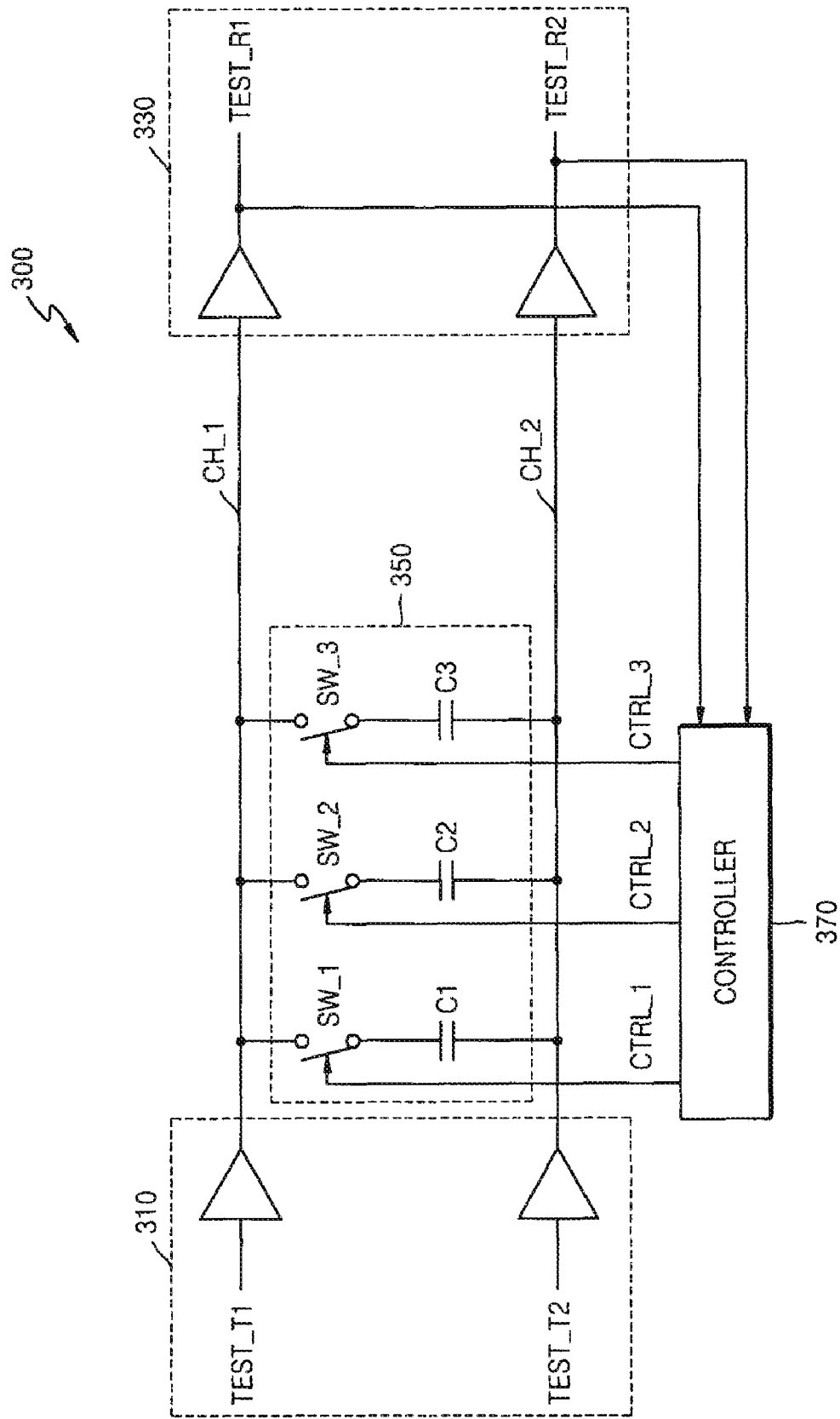
FIG. 3 is a block diagram of a semiconductor memory device according to an embodiment of the present invention.

FIG. 3 is a block diagram of a semiconductor memory device 300 according to an embodiment of the present invention. Referring to FIG. 3, the semiconductor memory device 300 includes a transmitter 310, a receiver 330, a plurality of channels CH_1 and CH_2, a crosstalk compensator 350, and a controller 370.

The channels CH_1 and CH_2 transmit signals from the transmitter 310 to the receiver 330. The crosstalk compensator 350 is connected between the channels CH_1 and CH_2 to compensate for crosstalk. The crosstalk compensator 350 may include at least one or more capacitors and at least one or more switching units. In FIG. 3, the crosstalk compensator 350 includes three capacitors C1, C2, and C3 and three switching units SW_1, SW_2, and SW_3. However, it will be understood by those of ordinary skill in the art that the crosstalk compensator 350 may include a different number of capacitors and a different number of switching units. The capacitors C1, C2, and C3 may be connected in parallel between the channels CH_1 and CH_2. The switching units SW_1, SW_2, and SW_3 may be connected between the capacitors C1, C2, and C3, respectively, and the channel CH_1. In other words, the switching unit SW_1 is connected between the capacitor C1 and the channel CH_1 to control a connection or a disconnection between the capacitor C1 and the channel CH_1. The switching unit SW_2 is connected between the capacitor C2 and the channel CH_1 to control a connection or a disconnection between the capacitor C2 and the channel CH_1. The switching unit SW_3 is connected between the capacitor C3 and the channel CH_1 to control a connection or a disconnection between the capacitor C3 and the channel CH_1. Therefore, the crosstalk compensator 350 of the present embodiment may have a predefined capacitance value. Thus, when signals out of phase with each other are transmitted, the crosstalk compensator 350 compensates for a timing difference occurring between the transmitted signals. When signals in phase with each other are transmitted, the capacitance value does not affect the transmitted signals and thus does not delay the transmitted signals.

The controller 370 controls the switching units SW_1, SW_2, and SW_3 to determine the capacitance value of the crosstalk compensator 350. In other words, the controller 370 outputs signals CTRL_1, CTRL_2, and CTRL_3 and the switching units connects the capacitors C1, C2, and C3 to the channels CH_1 and CH_2 or do not connect the capacitors C1, C2, and C3 to the channels CH_1 and CH_2 responsive to the signals CTRL_1, CTRL_2, and CTRL_3 that respectively correspond to the switching units SW_1, SW_2, and SW_3.

In some embodiments of the present invention, signals are transmitted with changes in capacitance, and then the transmitted signals are compared with one another to detect optimal capacitance. The controller 370 may turn on or off the switching units SW_1, SW_2, and SW_3 using the signals CTRL_1, CTRL_2, and CTRL_3, transmit a first test signal TEST_T1 through the channel CH_1, and transmit a second test signal TEST_T2 through the channel CH_2.

For example, if only the switching unit SW_1 is turned on, and the switching unit SW_2 and SW_3 are turned off, the crosstalk compensator 350 has a capacitance value of the capacitor C1, and the controller 370 receives the first and second test signals TEST_T1 and TEST_T2 to determine whether crosstalk is at a minimum. If the crosstalk is not at a minimum, and thus a timing difference continuously occurs, the controller 370 may turn on only the switches SW_1 and SW_2, turn off the switch SW_3, and re-perform the above-described process. In this case, the crosstalk compensator 350 has a capacitance value that is equal to a sum of the capacitance value of the capacitor C1 and a capacitance value of the capacitor C2, and the controller 370 receives the first and second test signals TEST_T1 and TEST_T2 to determine whether the crosstalk is at a minimum. If the crosstalk is at a minimum, the controller 370 may turn on the switches SW_1 and SW_2 and turn off the switch SW_3 when signals are transmitted later. It has been described that capacitors are turned on one by one. However, it will be understood by those of ordinary skill in the art that two or three or more capacitors may be simultaneously turned on depending on a degree of crosstalk of received signals.

According to another embodiment of the present invention, the controller 370 may compare transmitted signals TEST_T1 and TEST_T2 with received signals TEST_R1 and TEST_R2 and control the switching units SW_1, SW_2, and SW_3 responsive to the comparison result.

For example, if a timing difference of 30 ps occurs between the transmitted signals TEST_T1 and TEST_T2 and the received signals TEST_R1 and TEST_R2, respectively, the crosstalk compensator 350 may have a capacitance of 0.1 pF. If the timing difference of 60 ps occurs between the transmitted signals TEST_T1 and TEST_T2 and the received signals TEST_R1 and TEST_R2. respectively, the crosstalk compensator 350 may have capacitance of 0.2 pF. Predefined signals TEST_T1 and TEST_T2 are transmitted through the corresponding channels CH_1 and CH_2 and then compared with the received signals TEST_R1 and TEST_R2, respectively. Thus, the timing difference of 30 ps occurs between the transmitted signals TEST_T1 and TEST_T2 and the received signals TEST_R1 and TEST_R2, respectively. In this case, the controller 370 controls the switching units SW_1, SW_2, and SW_3 so that the crosstalk compensator 350 has the capacitance of 0.1 pF. The above-described method is useful when there is a known optimal capacitance value corresponding to a timing difference between a transmitted signal and a received signal.

Figure 4:
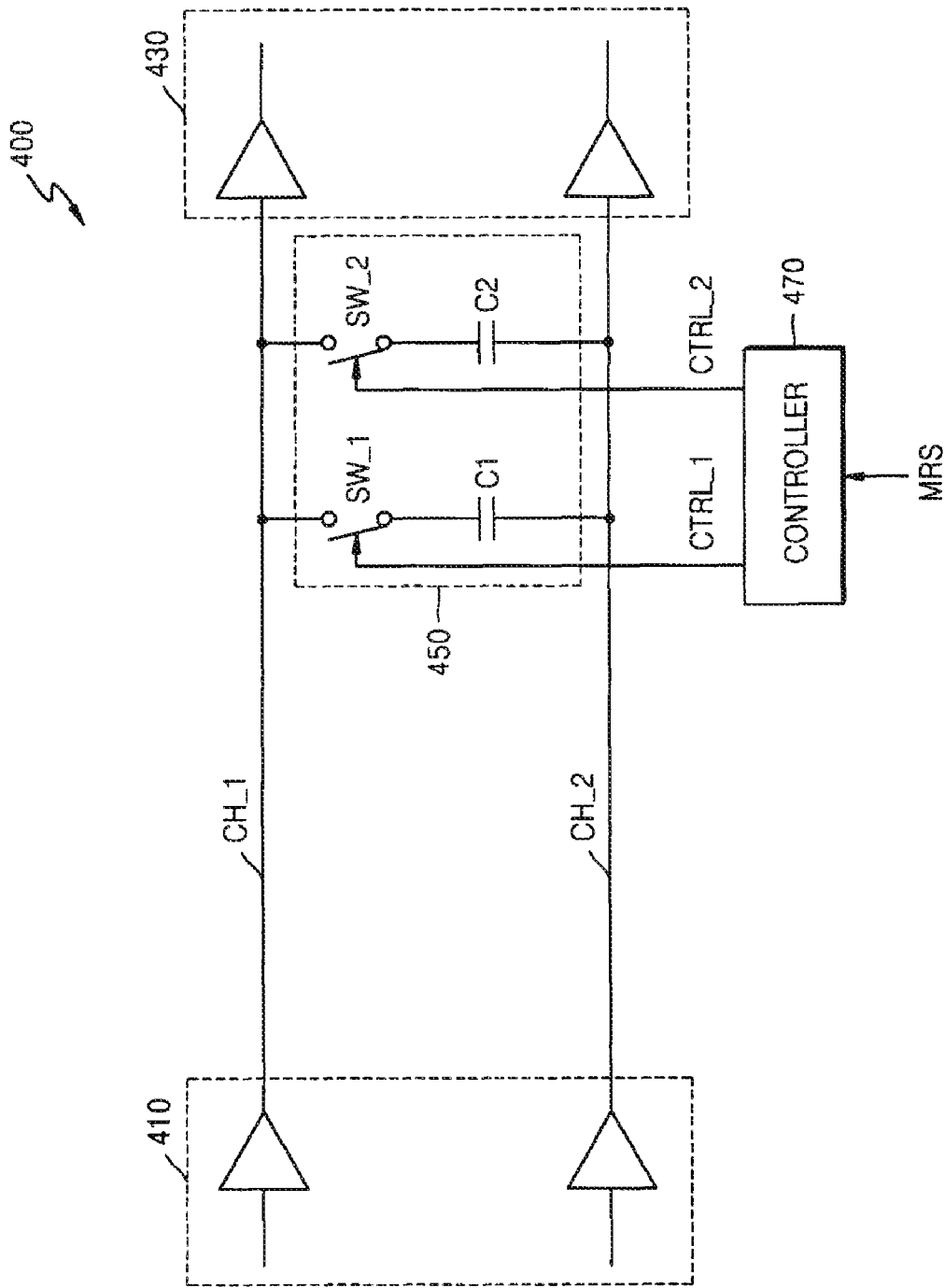
FIG. 4 is a block diagram of a semiconductor memory device according to another embodiment of the present invention.

FIG. 4 is a block diagram of a semiconductor memory device 400 according to another embodiment of the present invention. Referring to FIG. 4, similar to the semiconductor memory device 300 of FIG. 3, the semiconductor memory device 400 of FIG. 4 includes a transmitter 410, a receiver 430, a plurality of channels CH_1 and CH_2, a crosstalk compensator 450, and a controller 470. However, the crosstalk compensator 450 is connected between the channels CH_1 and CH_2 to be adjacent to the receiver 430. In other words, the crosstalk compensator 350 may be connected between the channels CH_1 and CH_2 to be adjacent to the transmitter 310 as shown in FIG. 3 or may be connected between the channels CH_1 and CH_2 to be adjacent to the receiver 430 as shown in FIG. 4.

A method of determining capacitance of the crosstalk compensator 450 will now be described with reference to FIG. 4.

The method of determining the optimal capacitance through training has been described with reference to FIG. 3. However, there will now be described a case whether an optical capacitance value is known. In other words, if the optimal capacitance value is known, the controller 470 may control each of the switching units SW_1 and SW_2 responsive to a signal applied from an external source or a Mode Register Set (MRS) signal to determine a capacitance value of the crosstalk compensator 450.

Figure 5:
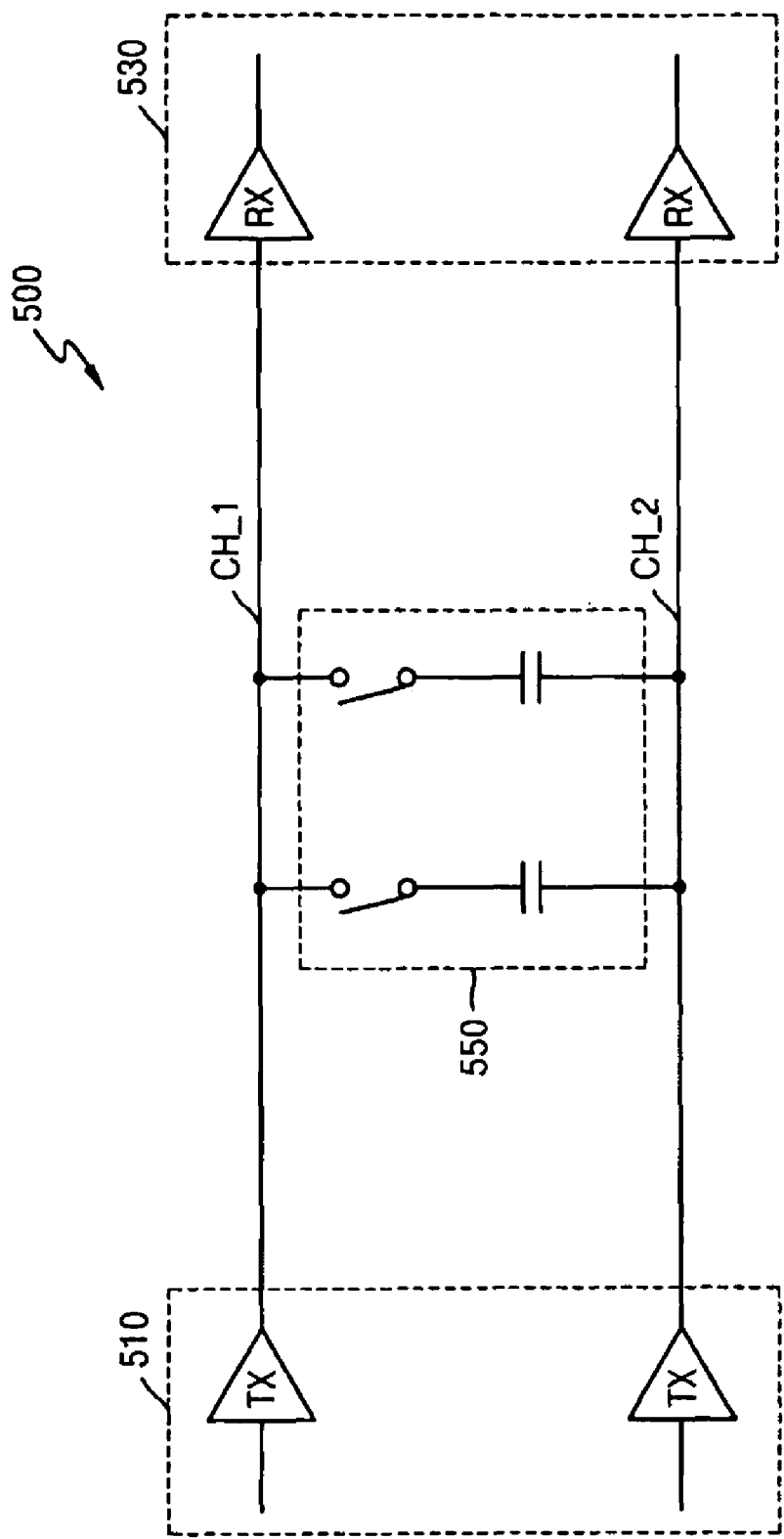
FIG. 5 is a block diagram of a semiconductor memory device according to another embodiment of the present invention.

FIG. 5 is a block diagram of a semiconductor memory device 500 according to another embodiment of the present invention. Referring to FIG. 5, similar to the semiconductor memory device 300 of FIG. 3, the semiconductor memory device 500 of FIG. 5 includes a transmitter 510, a receiver 530, a plurality of channels CH_1 and CH_2, a crosstalk compensator 550, and a controller (not shown). The controller performs a similar operation to the controller 370 of FIG. 3 or the controller 470 of FIG. 4 and thus is omitted in FIG. 5. For this reason, the controller will not be illustrated in FIGS. 6 through 8. In contrast to the crosstalk compensator 350 of FIG. 3 or the crosstalk compensator 450 of FIG. 4, the crosstalk compensator 550 is connected between the channels CH_1 and CH_2 and disposed in substantially the center region between the transmitter 510 and the receiver 530.

Figure 6:
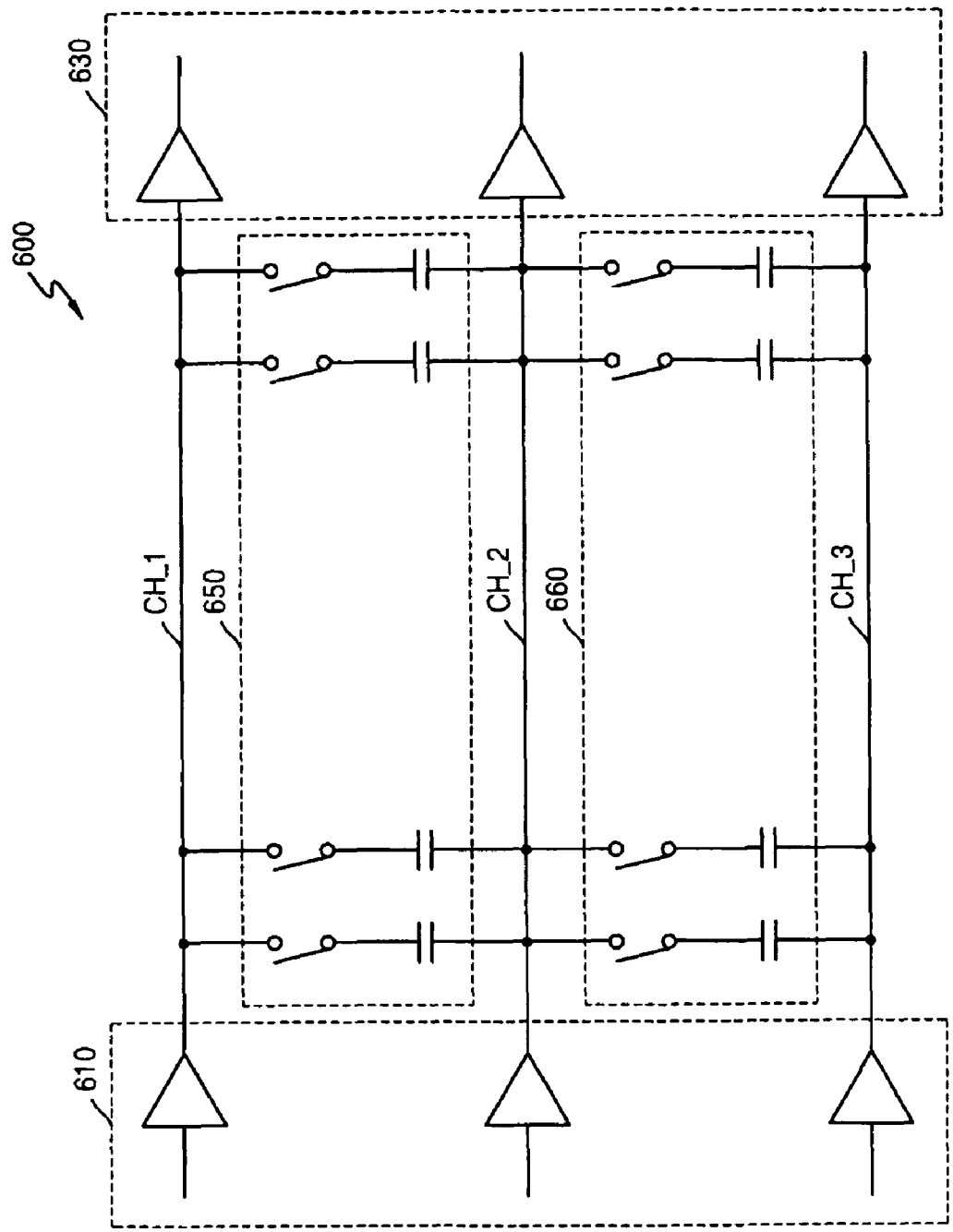
FIG. 6 is a block diagram of a semiconductor memory device according to another embodiment of the present invention.

FIG. 6 is a block diagram of a semiconductor memory device 600 according to another embodiment of the present invention. Referring to FIG. 6, similar to the semiconductor memory device 300 of FIG. 3, the semiconductor memory device 600 of FIG. 6 includes a transmitter 610, a receiver 630, a plurality of channels CH_1, CH_2, and CH_3, crosstalk compensators 650 and 660, and a controller (not shown). In the semiconductor memory device 600, at least one capacitor and at least one switching unit of each of the crosstalk compensators 650 and 660 of the semiconductor memory device 600 are adjacent to the transmitter 610 and disposed between channels. Other capacitors and other switching units of each of the crosstalk compensators 650 and 660 are adjacent to the receiver 630 and disposed between channels. Signals are transmitted through three channels CH_1, CH_2, and CH_3 in FIG. 6. The crosstalk compensators 650 and 660 may be connected among channels CH_1, CH_2, and CH_3.

Figure 7:
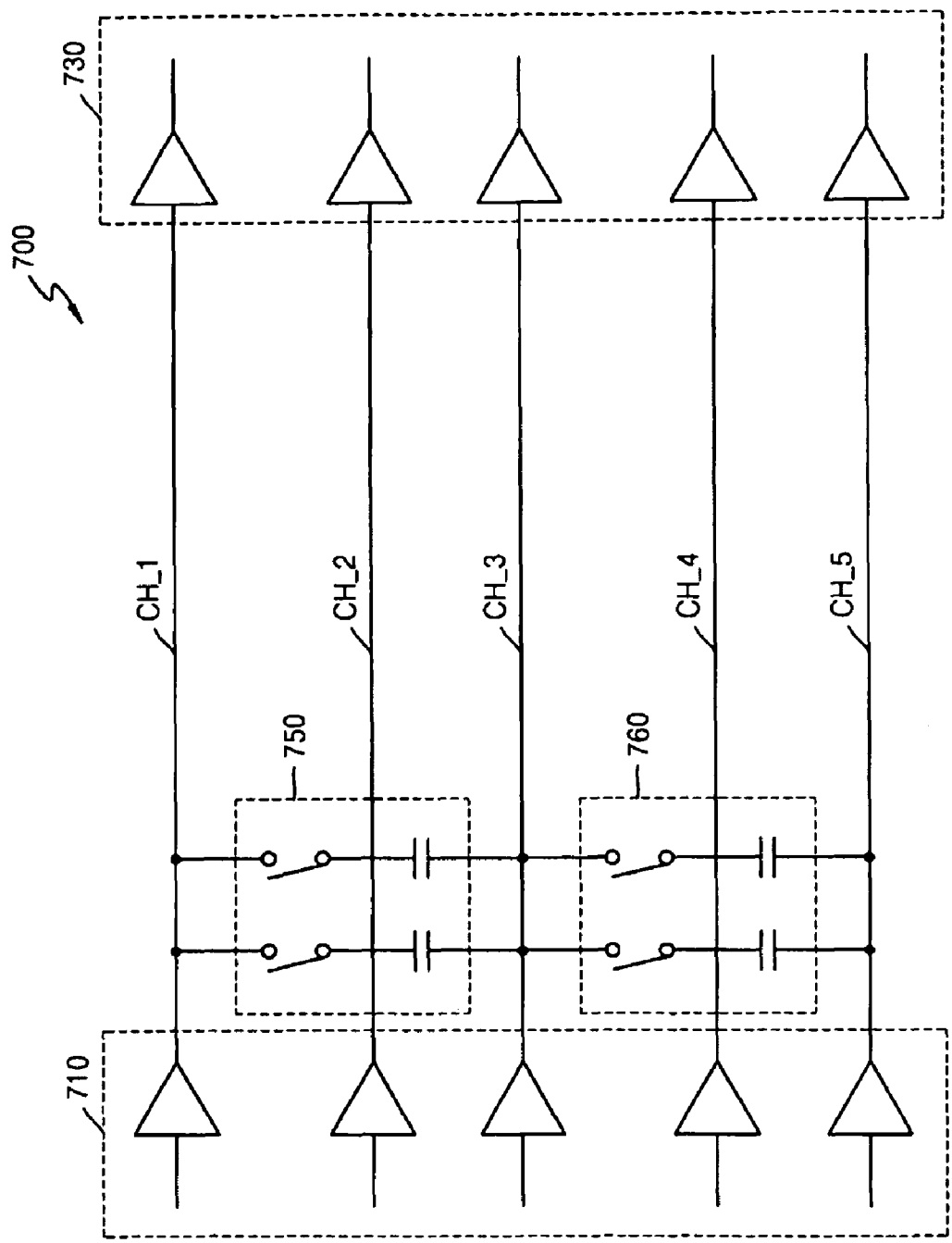
FIG. 7 is a block diagram of a semiconductor memory device according to another embodiment of the present invention.

FIG. 7 is a block diagram of a semiconductor memory device 700 according to another embodiment of the present invention. Referring to FIG. 7, similar to the semiconductor memory device 300 of FIG. 3, the semiconductor memory device 700 of FIG. 7 includes a transmitter 710, a receiver 730, a plurality of channels CH_1, CH_2, CH_3, CH_4, and CH_5, crosstalk compensators 750 and 760, and a controller (not shown). In the semiconductor memory device 700 of FIG. 7, each of the crosstalk compensators 750 and 760 is connected between channels that are not adjacent to each other. In other words, the crosstalk compensator 750 is connected between the channels CH_1 and CH_3, and the crosstalk compensator 760 is connected between the channels CH_3 and CH_5. In other words, a crosstalk compensator may be connected between adjacent channels as shown in FIGS. 3 through 6, or each of the crosstalk compensators 750 and 760 may be connected between channels that are not adjacent to each other as shown in FIG. 7.

Accordingly, a position of a crosstalk compensator may be selected in consideration of a structure, a loading or operating speed, crosstalk, or the like, of a system as in the embodiments illustrated with reference to FIGS. 3 through 7.

Figure 8:
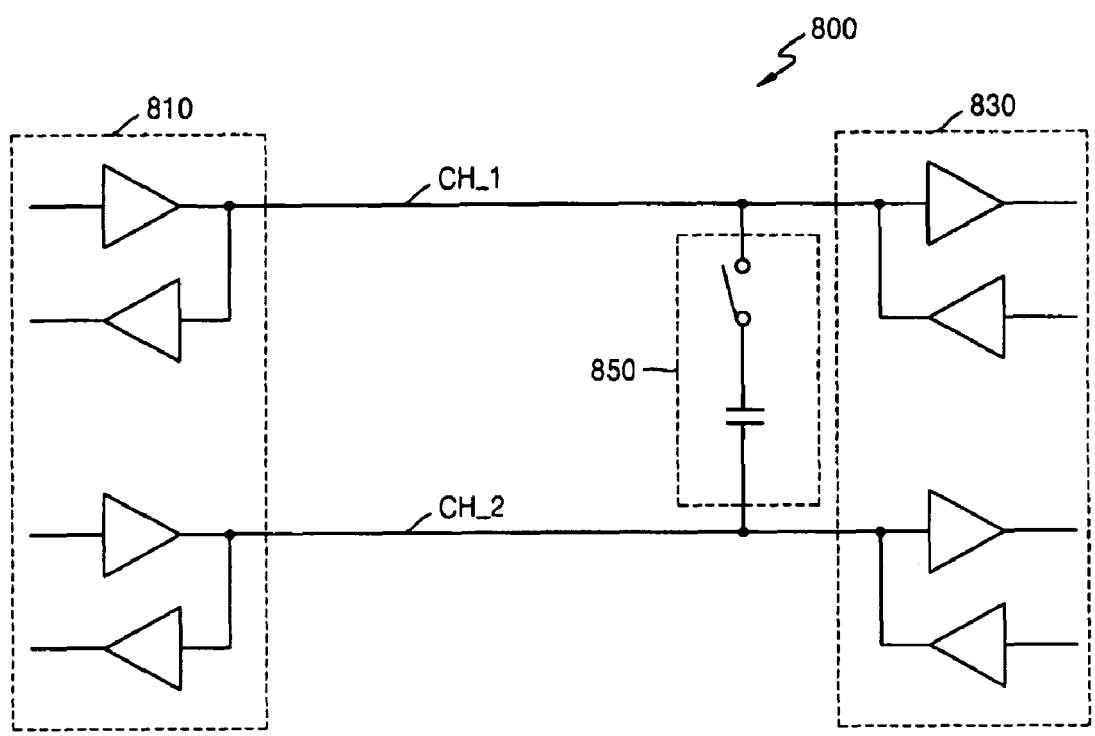
FIG. 8 is a block diagram of a semiconductor memory device according to another embodiment of the present invention.

FIG. 8 is a block diagram of a semiconductor memory device 800 according to another embodiment of the present invention. Referring to FIG. 8, the semiconductor memory device 800 of FIG. 8 includes a first transmitter 810, a second transmitter 830, a plurality of channels CH_1 and CH_2, a crosstalk compensator 850, and a controller (not shown). In FIG. 8, the first transmitter 810 or the second transmitter 830 may perform bidirectional transmissions and receptions. As shown in FIG. 8, the crosstalk compensator 850 may be connected between channels in a semiconductor memory device that enables bidirectional transmissions and receptions.

Figure 9A:
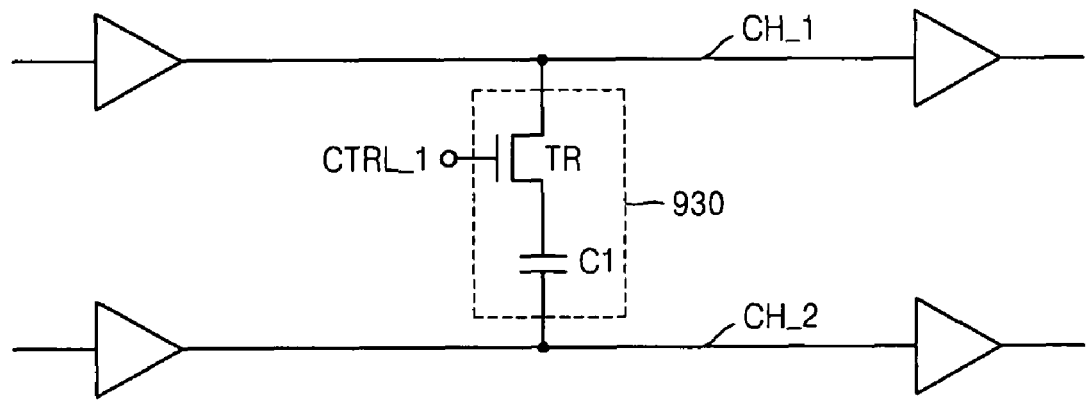
FIG. 9A is a circuit diagram of a crosstalk compensator of one of FIGS. 3 through 8, according to an embodiment of the present invention.

FIG. 9A is a circuit diagram of a crosstalk compensator of one of FIGS. 3 through 8, according to an embodiment of the present invention. The crosstalk compensator may be constructed using capacitors and switches in FIGS. 3 through 8. For example, the crosstalk compensator may be constructed using a capacitor C1 and a transistor TR as shown in FIG. 9A. Referring to FIGS. 3 and 9A, the signal CTRL_1 output from the controller 370 may be applied to a gate of the transistor TR. A first node of the transistor TR may be connected to a channel CH_1, and a second node of the transistor TR may be connected to the capacitor C1. The transistor TR is turned on or off responsive to the signal CTRL_1 output from the controller 370 and thus may perform a similar operation as the switch SW_1 of FIG. 3. The crosstalk compensators illustrated in FIGS. 4 through 8 may be constructed in a similar way as the crosstalk compensator of FIG. 9A.

Figure 9B:
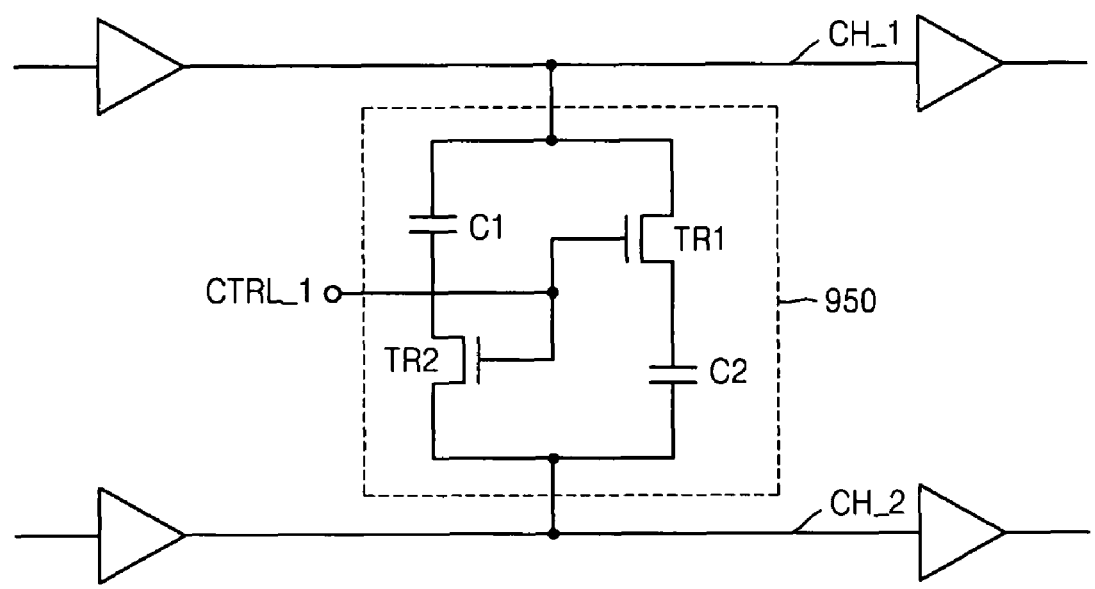
FIG. 9B is a circuit diagram a crosstalk compensator of one of FIGS. 3 through 8, according to another embodiment of the present invention.

FIG. 9B is a circuit diagram a crosstalk compensator of one of FIGS. 3 through 8, according to another embodiment of the present invention. Referring to FIG. 9B, the crosstalk compensator of the present embodiment may be constructed using a plurality of capacitors C1 and C2 and a plurality of transistors TR1 and TR2. Referring to FIGS. 3 and 9B, the signal CTRL_1 output from the controller 370 may be applied to a gate of the transistor TR1. A first node of the transistor TR1 may be connected to a channel CH_1 and the capacitor C1, and a second node of the TR1 may be connected to the capacitor C2. The signal CTRL_1 output from the controller 370 may be applied to a gate of the transistor TR2. A first node of the transistor TR2 may be connected to the capacitor C1, and a second node of the transistor TR2 may be connected to a channel CH_2 and the capacitor C2. The transistors TR1 and TR2 are turned on or off responsive to the signal CTRL_1 output from the controller 370 and thus may perform similar operations as the switch SW_1 of FIG. 3. The crosstalk compensators illustrated in FIGS. 4 through 8 may be constructed in a similar way as the crosstalk compensator of FIG. 9B.

Figure 10:
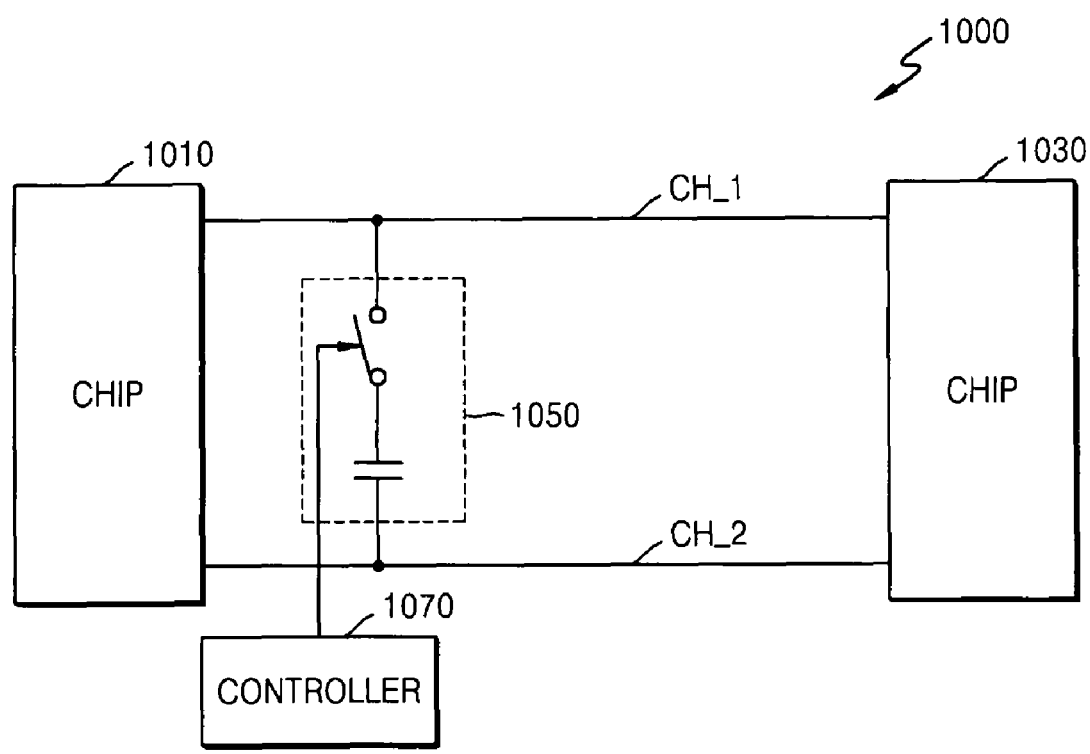
FIG. 10 is a block diagram of a semiconductor memory system according to an embodiment of the present invention.

FIG. 10 is a block diagram of a semiconductor memory system 1000 according to an embodiment of the present invention. Referring to FIG. 10, the semiconductor memory system 1000 includes a first memory chip 1010, a second memory chip 1030, a plurality of channels CH_1 and CH_2, a crosstalk compensator 1050, and a controller 1070. Structures and operations of the crosstalk compensator 1050 and the controller 1070 may be similar to those of the compensators and the controllers illustrated with reference to FIGS. 3 through 9B, and thus their detailed descriptions will be omitted herein.

In the embodiments illustrated with reference to FIGS. 3 through 8, a semiconductor memory device transmits signals in the semiconductor memory device, e.g., in a memory chip, through channels. The semiconductor memory system 1000 of FIG. 10 transmits signals through channels that are connected between memory chips. Accordingly, in the embodiments of the present invention, crosstalk is compensated for when signals are transmitted through channels in a semiconductor memory device, e.g., in a memory chip. Further, crosstalk is compensated for even if signals are transmitted through channels between memory chips in a semiconductor memory system.

Figure 11A:
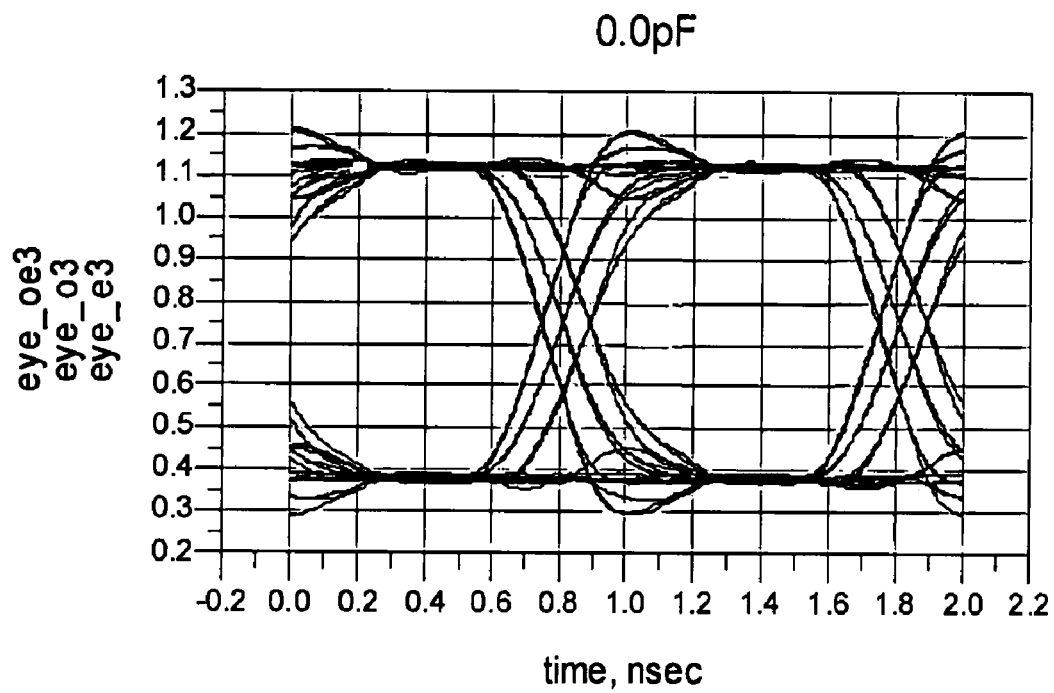
FIG. 11A is a graph illustrating waveforms of signals output from a receiver according to the prior art.
Figure 11B:
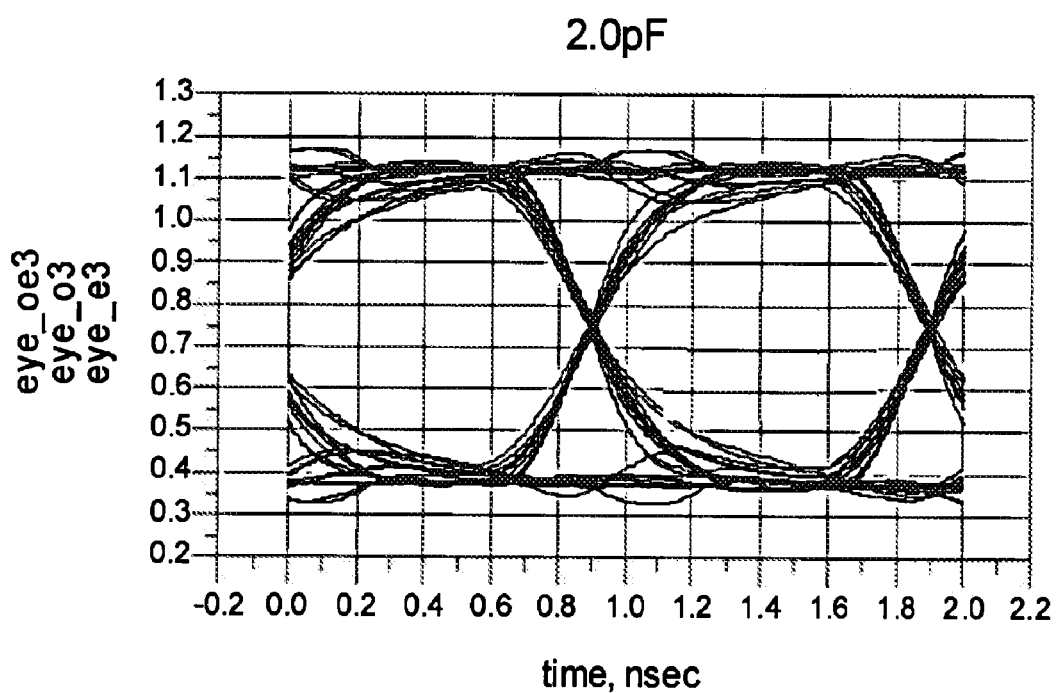
FIG. 11B is a graph illustrating waveforms of signals output from a receiver according to an embodiment of the present invention.

FIG. 11A is a graph illustrating waveforms of signals output from a receiver according to the prior art, and FIG. 11B is a graph illustrating waveforms of signals output from a receiver according to an embodiment of the present invention.

In the embodiments of the present invention, skew occurring due to timing differences between transmitted signals is compensated for. As described above, in a semiconductor memory device and a semiconductor memory system according to embodiments of the present invention, crosstalk is compensated for, which occurs between transmitted signals out of phase with each other.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor memory device comprising:
 a plurality of channels configured to transmit signals from a transmitter to a receiver;
 a crosstalk compensator connected between the channels to compensate for crosstalk, wherein the crosstalk compensator comprises:
  at least one capacitor connected in parallel between the channels; and
  at least one switching unit connected between the at least one capacitor and one of the channels, the at least one switching unit being configured to control connections or disconnections between the at least one capacitor and the channel; and
 a controller configured to control the at least one switching unit to determine capacitance of the crosstalk compensator,
 wherein the controller is configured to transmit test signals through the channels and turn on or off the at least one switching unit to minimize crosstalk occurring between the transmitted test signals.

2. The semiconductor memory device of claim 1, wherein the crosstalk compensator is connected between the channels in substantially a center region between the transmitter and the receiver.

3. The semiconductor memory device of claim 1, wherein the crosstalk compensator is connected between the channels and adjacent to the transmitter.

4. The semiconductor memory device of claim 1, wherein the crosstalk compensator is connected between the channels and adjacent to the receiver.

5. The semiconductor memory device of claim 1, wherein the at least one capacitor comprises at least one first capacitor and the at least one switching unit comprises at least one first switching unit, wherein the crosstalk compensator comprises at least one second capacitor and at least one second switching unit connected between the channels and adjacent to the transmitter, and wherein the at least one first capacitor and the at least one first switching unit are connected between the channels and adjacent to the receiver.

6. The semiconductor memory device of claim 1, wherein the crosstalk compensator is connected between adjacent channels.

7. The semiconductor memory device of claim 1, wherein the crosstalk compensator is connected between channels that are not adjacent to each other.

8. The semiconductor memory device of claim 1, wherein the controller is configured to control the at least one switching unit responsive to delay degrees of the transmitted test signals to determine the capacitance.

9. The semiconductor memory device of claim 1, wherein the controller is configured to control the at least one switching unit responsive to one of a signal applied from an external source and a Mode Register Set (MRS) signal to determine the capacitance.

10. The semiconductor memory device of claim 1, wherein the at least one switching unit is a switch that is turned on or off responsive to a signal output from the controller.

11. The semiconductor memory device of claim 10, wherein the signal output from the controller is generated by comparing input signals of the transmitter with output signals of the receiver.

12. The semiconductor memory device of claim 1, wherein the at least one switching unit is a transistor that comprises a gate, a first node, and a second node, wherein a signal output from the controller is applied to the gate, wherein the first node is connected to the channel, and wherein the second node is connected to the capacitor.

13. A semiconductor memory system comprising:
 a plurality of channels configured to transmit signals from a first memory chip to a second memory chip;
 a crosstalk compensator connected between the channels to compensate for crosstalk, wherein the crosstalk compensator comprises:
  at least one capacitor connected in parallel between the channels; and
  at least one switching unit connected between the capacitors and one of the channels, and the at least one switching unit is configured to control connections or disconnections between the at least one capacitor and the channel; and
 a controller configured to control the at least one switching unit to determine capacitance of the crosstalk compensator, wherein the controller is configured to transmit test signals through the channels and to turn on or off the at least one switching unit to minimize crosstalk occurring between the transmitted test signals.

14. The semiconductor memory system of claim 13, wherein the crosstalk compensator is connected between the channels in substantially a center region between the first and second memory chips.

15. The semiconductor memory system of claim 13, wherein the crosstalk compensator is connected between the channels and adjacent to the first memory chip.

16. The semiconductor memory system of claim 13, wherein the crosstalk compensator is connected between the channels and adjacent to the second memory chip.

17. The semiconductor memory system of claim 13, wherein the at least one capacitor comprises at least one first capacitor and the at least one switching unit comprises at least one first switching unit, wherein the crosstalk compensator comprises at least one second capacitor and at least one second switching unit connected between the channels and adjacent to the first memory chip, and wherein the at least one first capacitor and the at least one first switching unit are connected between the channels and adjacent to the second memory chip.

18. The semiconductor memory device of claim 13, wherein the controller is configured to control the at least one switching unit responsive to one of a signal applied from an external source and a Mode Register Set (MRS) signal to determine the capacitance.

19. The semiconductor memory device of claim 13, wherein the controller is configured to generate a signal to control the at least one switching unit responsive to comparing input signals of the transmitter with output signals of the receiver.

20. A semiconductor memory device comprising:
first through fifth sequentially adjacent channels configured to transmit signals from a transmitter to a receiver; and
a crosstalk compensator connected between the channels to compensate for crosstalk,
wherein the crosstalk compensator comprises:
a first capacitor and a second capacitor connected in parallel between the first channel and the third channel;
a third capacitor and a fourth capacitor connected in parallel between the third channel and the fifth channel;
a first switching unit and a second switching unit connected between the first capacitor and the second capacitor, respectively, and the first channel, wherein the first and second switching units are configured to control connections or disconnections between the first and second capacitors, respectively, and the first channel; and
a third switching unit and a fourth switching unit connected between the third capacitor and the fourth capacitor, respectively, and the third channel, wherein the third and fourth switching units are configured to control connections or disconnections between the third and fourth capacitors, respectively, and the third channel.

21. A semiconductor memory device comprising:
a plurality of channels configured to transmit signals from a transmitter to a receiver;
a crosstalk compensator connected between the channels to compensate for crosstalk, wherein the crosstalk compensator comprises:
at least one capacitor connected in parallel between the channels; and
at least one switching unit connected between the at least one capacitor and one of the channels, the at least one switching unit being configured to control connections or disconnections between the at least one capacitor and the channel; and
a controller configured to control the at least one switching unit to determine capacitance of the crosstalk compensator,
wherein the controller is configured to transmit test signals through the channels and to control the at least one switching unit responsive to delay degrees of the transmitted test signals to determine the capacitance.

22. A semiconductor memory device comprising:
a plurality of channels configured to transmit signals from a transmitter to a receiver;
a crosstalk compensator connected between the channels to compensate for crosstalk, wherein the crosstalk compensator comprises:
at least one capacitor connected in parallel between the channels; and
at least one switching unit connected between the at least one capacitor and one of the channels, the at least one switching unit being configured to control connections or disconnections between the at least one capacitor and the channel; and
a controller configured to control the at least one switching unit to determine capacitance of the crosstalk compensator,
wherein the controller is configured to control the at least one switching unit responsive to one of a signal applied from an external source and a Mode Register Set (MRS) signal to determine the capacitance.

* * * * *